US010280501B2

(12) United States Patent
Mogi et al.

(10) Patent No.: US 10,280,501 B2
(45) Date of Patent: May 7, 2019

(54) ROUGHENED COPPER FOIL, COPPER CLAD LAMINATE, AND PRINTED CIRCUIT BOARD

(71) Applicant: MITSUI MINING & SMELTING CO., LTD., Tokyo (JP)

(72) Inventors: Satoshi Mogi, Ageo (JP); Hiroaki Tsuyoshi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/528,872

(22) PCT Filed: Apr. 6, 2016

(86) PCT No.: PCT/JP2016/061317
§ 371 (c)(1),
(2) Date: May 23, 2017

(87) PCT Pub. No.: WO2017/056534
PCT Pub. Date: Apr. 6, 2017

(65) Prior Publication Data
US 2018/0223412 A1    Aug. 9, 2018

(30) Foreign Application Priority Data
Sep. 30, 2015 (JP) ................... 2015-194225

(51) Int. Cl.
*B21C 37/00* (2006.01)
*C23C 8/42* (2006.01)
(Continued)

(52) U.S. Cl.
CPC ............ *C23C 8/42* (2013.01); *B32B 15/20* (2013.01); *C23C 8/80* (2013.01); *C23C 26/00* (2013.01);
(Continued)

(58) Field of Classification Search
None
See application file for complete search history.

(56) References Cited

U.S. PATENT DOCUMENTS 5,492,595 A    2/1996  Carano et al.
5,501,350 A *  3/1996  Yoshida ............... C23C 22/63
                                                216/101
(Continued)

FOREIGN PATENT DOCUMENTS

JP    2002-060866 A    2/2002
JP    2002-180157 A    6/2002
(Continued)

OTHER PUBLICATIONS

International Search Report issued with respect to application No. PCT/JP2016/061317, dated Jun. 14, 2016.
(Continued)

*Primary Examiner* — Seth Dumbris
(74) *Attorney, Agent, or Firm* — Greenblum & Bernstein, P.L.C.

(57) ABSTRACT

There is provided a roughened copper foil which can significantly improve adhesion to an insulating resin and reliability (e.g., hygroscopic heat resistance). The roughened copper foil of the present invention has at least one roughened surface having fine irregularities composed of acicular crystals, wherein the entire surface of the acicular crystals is composed of a mixed phase of Cu metal and $Cu_2O$.

5 Claims, 7 Drawing Sheets

(51) Int. Cl.
  *B32B 15/20* (2006.01)
  *C25D 1/04* (2006.01)
  *C23C 26/00* (2006.01)
  *C23C 8/80* (2006.01)
  *C23C 28/00* (2006.01)
  *C25D 3/38* (2006.01)
  *C25D 5/48* (2006.01)
  *H05K 3/02* (2006.01)
  *H05K 3/18* (2006.01)
  *H05K 3/38* (2006.01)
  *H05K 1/09* (2006.01)

(52) U.S. Cl.
  CPC .......... *C23C 28/322* (2013.01); *C23C 28/345* (2013.01); *C25D 1/04* (2013.01); *C25D 3/38* (2013.01); *C25D 5/48* (2013.01); *H05K 3/022* (2013.01); *H05K 3/188* (2013.01); *H05K 3/385* (2013.01); *H05K 1/09* (2013.01); *H05K 2201/0355* (2013.01); *H05K 2203/0307* (2013.01); *H05K 2203/0315* (2013.01); *H05K 2203/0723* (2013.01); *H05K 2203/0726* (2013.01); *H05K 2203/0776* (2013.01); *H05K 2203/1157* (2013.01); *Y10T 428/1259* (2015.01); *Y10T 428/12431* (2015.01); *Y10T 428/12438* (2015.01)

(56) References Cited

U.S. PATENT DOCUMENTS

2003/0227073 A1* 12/2003 Yurino ................ H01L 23/3142
                                                        257/666
2005/0244621 A1* 11/2005 Arai ..................... H05K 3/0038
                                                        428/209
2012/0125514 A1*  5/2012 Wei ....................... H05K 3/385
                                                        156/60

FOREIGN PATENT DOCUMENTS

| | | | |
|---|---|---|---|
| JP | 2006-249519 A | 11/2005 | |
| JP | 2008-248269 A | 10/2008 | |
| JP | 2009-026491 A | 5/2009 | |
| KR | 1993-0002220 B1 | 3/1993 | |
| TW | 321689 B | 12/1997 | |
| TW | 201524279 A | 6/2015 | |
| WO | 2010/110092 A1 | 9/2010 | |
| WO | 2014/126193 A1 | 8/2014 | |
| WO | WO2014126193 * | 8/2014 | ............... H05K 1/09 |
| WO | 2015/040998 A1 | 3/2015 | |
| WO | 2015/111756 A1 | 7/2015 | |

OTHER PUBLICATIONS

Written Opinion of International Search Report with respect to application No. PCT/JP2016/061317, dated Jun. 14, 2016.
Taiwanese Office Action issued with respect to Application No. 105122915, dated Mar. 23, 2017.
Japanese Office Action issued with respect to Application No. 2016-544486, dated Oct. 28, 2016.
Kotei, Shurui, Yotobetsu, Mekki Saishin Gijutsu, Mechanism no Kosatsu to Hinshitsu Kojo, first print, Kabushiki Kaisha Joho Kiko, May 18, 2006 (May 18, 2006), pp. 678 to 680.
Korean Office Action from Application No. 10-2017-7013926 dated Jun. 27, 2017.
Chinese Office Action from Application No. 201680003882.4 dated Nov. 10, 2017.

* cited by examiner

ROUGHENED COPPER FOIL, COPPER CLAD LAMINATE, AND PRINTED CIRCUIT BOARD

TECHNICAL FIELD

The present invention relates to a roughened copper foil, a copper clad laminate and a printed circuit board.

BACKGROUND ART

Roughened copper foils have been proposed for printed circuit board suitable to form fine-pitch circuits. Such copper foils have roughened surfaces with fine irregularities formed through oxidation treatment and then reduction treatment (hereinafter sometimes collectively referred to as oxidation-reduction treatment).

For example, Patent Document 1 (WO2014/126193) discloses a surface-treated copper foil which is provided with a roughened layer having acicular fine irregularities composed of a copper complex compound having a maximum length of 500 nm or less. Furthermore, Patent Document 2 (WO2015/040998) discloses a copper foil which has, on at least one side thereof, a roughened layer having fine irregularities, i.e., acicular protrusions having a maximum length of 500 nm or less composed of a copper composite compound and has a silane coupling agent layer on the surface of the roughened layer. These roughened copper foils disclosed in these documents achieve high adhesion to the insulating resin base materials by the anchor effect due to the fine roughness of the layer and also enable formation of fine pitch circuits with high etching factors. Both the roughened layers having fine irregularities disclosed in Patent Documents 1 and 2 are formed through oxidation-reduction treatment after preliminary treatment such as alkaline degreasing. The fine irregularities formed in this way have a unique shape of acicular crystals composed of a copper composite compound. The roughened surfaces having such fine irregularities are generally finer than roughened surfaces formed by the attachment of the fine copper particles and roughened surfaces formed by etching.

CITATION LIST

Patent Documents

Patent Document 1: WO2014/126193
Patent Document 2: WO2015/040998

SUMMARY OF THE INVENTION

Requirements for the roughened surfaces having fine irregularities of acicular crystals formed by oxidation-reduction treatment are improvements in adhesion to the insulating resin and reliability.

The present inventors have now found that a roughened copper foil having at least one roughened surface over which fine irregularities of acicular crystals of a mixed phase of Cu metal and $Cu_2O$ extend has significantly improved adhesiveness to insulating resin and reliability (e.g., hygroscopic heat resistance).

Accordingly, an object of the present invention is to provide a roughened copper foil which can significantly improve adhesion to an insulating resin and reliability (e.g., hygroscopic heat resistance).

According to one embodiment of the present invention, there is provided a roughened copper foil having at least one roughened surface having fine irregularities composed of acicular crystals, wherein the entire surface of the acicular crystals is composed of a mixed phase of Cu metal and $Cu_2O$.

According to another embodiment of the present invention, there is provided a copper clad laminate comprising the roughened copper foil of the above-described embodiment.

According to another embodiment of the present invention, there is provided a printed circuit board comprising the roughened copper foil of the above-described embodiment.

DESCRIPTION OF EMBODIMENT

Roughened Copper Foil

Figure 1:
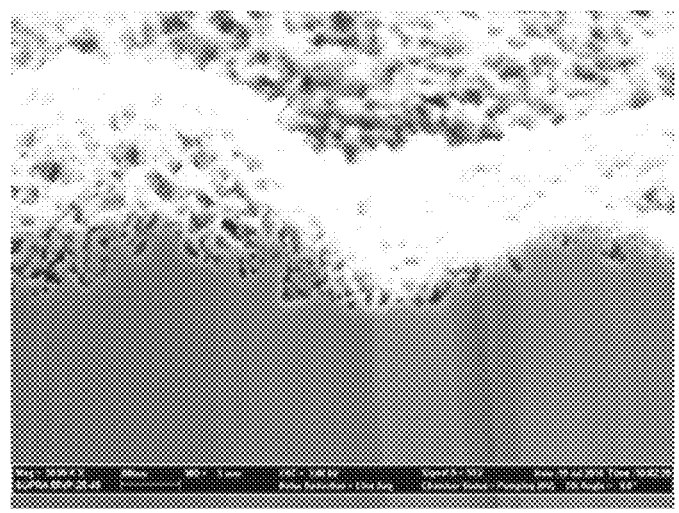
FIG. 1 is a cross-sectional SEM image of a cross section of fine irregularities constituting the roughened surface of the roughened copper foil prepared in Example 1.

The copper foil of the present invention is a roughened copper foil. This roughened copper foil has a roughened surface on at least one side. The roughened surface has fine irregularities composed of acicular crystals, and such fine irregularities can be formed through oxidation-reduction treatment. The acicular crystals are typically raised substantially perpendicular and/or diagonal to the copper foil surface, like turf. The entire roughened surface of the acicular crystals is composed of a mixed phase of Cu metal and $Cu_2O$. Thus, the entire surface of the acicular crystals can be composed of a mixed phase of Cu metal and $Cu_2O$ on the roughened surface having fine irregularities composed of acicular crystals to significantly improve the adhesion to the insulating resin, and reliability (for example, hygroscopic heat resistance). In particular, the roughened copper foil of the present invention has excellent adhesion not only in a normal state but also after moisture absorption and acid treatment to be able to exhibit stable high adhesion regardless of process history. Regarding the reliability, the roughened copper foil of the present invention can exert high hygroscopic heat resistance, for example, no or little deformation (e.g., swelling) even after being subjected to high temperature treatment (e.g., in a reflow furnace) or even after being left in a high humidity environment for a long time. In this regard, the present inventors had confirmed that the surface of the acicular crystals in the conventional roughened copper foil as disclosed in Patent Document 1 is composed mainly of Cu metal, and mixed phases of Cu metal and $Cu_2O$ are only localized. In contrast, the entire surface of the acicular crystals of the roughened copper foil of the present invention is composed of a mixed phase of Cu metal and $Cu_2O$, and therefore $Cu_2O$ can be evenly present in a planar state on the surface of the acicular crystal compared to the conventional roughened copper foils. $Cu_2O$ is likely to be more easily chemically bonded to the insulating resin than Cu metal. Thus, $Cu_2O$, which is more likely to be chemically bonded to the insulating resin, is evenly present on the surface of the acicular crystal in a planar state, resulting in significantly improved reliability such as adhesion to the insulating resin and hygroscopic heat resistance.

As described above, the fine irregularities of the roughened surface are composed of acicular crystals. The height of the acicular crystal (that is, the height measured in the vertical direction from the root of the acicular crystal) is preferably 50 to 400 µm, more preferably 100 to 400 µm, further preferably 150 to 350 µm. The height of such acicular crystals is relatively lower than that of the acicular crystals in the conventional roughened copper foils. Even at such a relatively low height of acicular crystals, a high adhesion can be achieved by the surface of the acicular crystals composed of mixed phases of Cu metal and $Cu_2O$ over the entire surface as described above. Such a relatively low height of the acicular crystals is probably formed by the oxidation-reduction treatment for formation of fine irregularities of acicular crystals composed of a mixed phase of Cu metal and $Cu_2O$ over the entire surface. Typically the acicular crystals have rounded tips in fine irregularities formed through such oxidation-reduction treatment. In particular, preferably acicular crystals are distributed at random to form a roughened layer rich in voids, more preferably, the void-enriched roughened layer has a morphology of densely packed acicular crystals like turf, from the viewpoint of improving the adhesion to the insulating resin.

The presence of mixed phases of Cu metal and $Cu_2O$ on the surface of the acicular crystals can be confirmed by identification using an electronic energy loss spectrum of the Cu-L edge observed by electron energy loss spectroscopy (EELS) using a scanning transmission electron microscope (STEM) (hereinafter referred to as STEM-EELS). Identification of the spectrum attributable to the Cu metal/$Cu_2O$ mixed phase will be described in more detail in the examples described later. In principle, the identification can be carried out by confirming that items i) to iv) below are satisfied. The term "about X eV" (X is an arbitrary value) described in the following criteria corresponds to a variation in the range of X±5 eV.

i) A peak $P_{938}$ is present at about 938 eV.
ii) A peak $P_{959}$ is present at about 959 eV.
iii) The intensity $I_{938}$ of the peak $P_{938}$ is roughly equal to or higher than the intensity $I_{959}$ of the peak $P_{959}$ (i.e., $I_{938} \approx I_{959}$ or $I_{938} < I_{959}$).
iv) Consequently, a valley is present between $P_{938}$ and $P_{959}$.

The mixed phase of Cu metal and $Cu_2O$ on the surface of the acicular crystal has a thickness of 10 nm or less, more typically 1 to 5 nm. The mixed phase having such a thickness can enhance the reactivity between the acicular crystal and the insulating resin to improve the adhesion not only in the normal state but also after moisture absorption and the acid treatment. The thickness of this mixed phase has any lower limit. It may be the size of one atom or the minimum size that can be confirmed by an analytical instrument.

In contrast, the interior of acicular crystals located under the surface composed of mixed phases is typically composed of a single phase of Cu metal. It can be confirmed by identification using the electronic energy loss spectrum of the Cu-L edge observed by STEM-EELS that the inside of the acicular crystal is composed of a single phase of Cu metal. The spectrum attributable to Cu metal can be identified in principle by confirming that items 1) to 4) below are satisfied.

1) A peak $P_{938}$ is present at about 938 eV.
2) A peak $P_{959}$ is present at about 959 eV.
3) The intensity $I_{959}$ of the peak $P_{938}$ is higher than the intensity $I_{938}$ of the peak $P_{959}$ (i.e., $I_{938} < I_{959}$).
4) Two additional peaks are present between about 940 eV and about 950 eV.

The roughened copper foil of the present invention may have any thickness, but has preferably a thickness of 0.1 to 35 µm, more preferably 0.5 to 18 µm. It should be noted that the roughened copper foil of the present invention may be not only an ordinary roughened copper foil but also a roughened copper foil with a carrier.

Method for Manufacturing

The roughened copper foil according to the present invention may be produced by any process. It is preferably produced through oxidation-reduction treatment. An example preferred method of manufacturing the roughened copper foil according to the present invention will be described below. This preferred method includes a step of preparing a copper foil and a roughening step (oxidation-reduction treatment) of sequentially performing a first pretreatment, a second pretreatment, an oxidation treatment and a reduction treatment on the surface.

(1) Preparation of Copper Foil

The copper foil used for manufacturing the roughened copper foil includes both an electrodeposited copper foil and a rolled copper foil, more preferably an electrodeposited copper foil. The copper foil may be either unroughened or preliminarily roughened. The copper foil has any thickness, but preferably a thickness of 0.1 to 35 µm, and more preferably 0.5 to 18 µm. The copper foil prepared in the form of a copper foil with a carrier can be formed by wet film forming (e.g., electroless copper plating and electrolytic copper plating), dry film forming (e.g., sputtering and chemical vapor deposition) or a combination thereof.

The surface of the copper foil to be roughened has a ten-point average roughness (Rzjis) of preferably 1.5 µm or less, more preferably 1.3 µm or less, more preferably 1.0 µm or less, as measured in accordance with JIS B0601-2001. The lower limit value is not defined, but is, for example, 0.1 µm or more.

(2) Roughening Treatment (Oxidation-Reduction Treatment)

The wet roughing treatment is preferably applied to the surface of the copper foil, where the first pretreatment, the second pretreatment, the oxidation treatment and the reduction treatment are sequentially performed. In particular, the surface of the copper foil is oxidized by a wet process using a solution to form a copper compound containing CuO on the copper foil surface. The copper compound is then subjected to a reduction treatment to convert CuO to Cu metal or $Cu_2O$ to form fine irregularities of acicular crystals with cores composed of Cu metal and shells composed of a mixed phase of Cu metal and $Cu_2O$. The fine irregularities are formed by a copper compound mainly containing CuO at the stage of oxidizing the surface of the copper foil by the wet process. When the copper compound is subjected to the reduction treatment, CuO is converted into Cu metal or $Cu_2O$ while the shape of the fine irregularities formed by the copper compound is being substantially maintained, resulting in fine irregularities composed of mixed phases of Cu metal and $Cu_2O$ over the whole surface. The surface of the copper foil subjected to an appropriate oxidation treatment by a wet process and then a reduction treatment can have specific fine irregularities characteristic to the present invention.

(2a) First Pretreatment

The first pretreatment involves immersing the copper foil in an aqueous sulfuric acid solution and then rinsing it with water. The aqueous sulfuric acid solution may contain any amount of sulfuric acid. The preferred content ranges from 1 to 20 mass %. The aqueous sulfuric acid solution may further contain hydrogen peroxide. The preferred content of hydrogen peroxide ranges from 1 to 5 mass %. The temperature of the aqueous sulfuric acid solution is preferably 20 to 50° C. The immersion time of the copper foil in the aqueous sulfuric acid solution is preferably 2 sec to 5 min.

(2b) Second Pretreatment

The second pretreatment involves immersing the copper foil subjected to the first pretreatment in an aqueous sodium hydroxide solution to perform alkaline degreasing and then rinsing it with water. The content of NaOH in the aqueous sodium hydroxide solution is preferably 20 to 60 g/L. The temperature of the aqueous sodium hydroxide solution is preferably from 30 to 60° C. The immersion time in the aqueous sodium hydroxide solution is preferably 2 sec to 5 min.

(2c) Oxidation Treatment

The oxidation treatment involves oxidizing the copper foil subjected to the second pretreatment using an alkaline solution such as a sodium hydroxide solution. The surface of the copper foil can be oxidized with an alkaline solution to form fine irregularities of acicular crystals composed of a copper composite compound mainly containing CuO on the surface of the copper foil. The alkaline solution has a temperature of preferably from 60 to 85° C. and a pH of preferably from 10 to 14, more preferably from 12 to 14. To facilitate oxidation, the alkaline solution preferably contains chlorate, chlorite, hypochlorite, and/or perchlorate in a total content of preferably 100 to 500 g/L. The oxidation treatment is preferably carried out by immersing the copper foil in an alkaline solution, and the immersion time (that is, the oxidation time) is preferably 10 sec to 20 min, more preferably 30 sec to 10 min.

The alkaline solution used for the oxidation treatment preferably further contains an oxidation inhibitor. Specifically, oxidation treatment on the surface of the copper foil with an alkaline solution may cause the protrusions to excessively grow beyond the desired length, precluding formation of desired fine irregularities. Accordingly, it is preferred to use an alkaline solution containing an oxidation inhibitor capable of moderating oxidation on the copper foil surface from the viewpoint of formation of the fine irregularities. Examples of the preferred oxidation inhibitor include amino functional silane coupling agents. Oxidation of the surface of the copper foil with an alkaline solution containing an amino functional silane coupling agent allows the silane coupling agent in the alkaline solution to be adsorbed on the surface of the copper foil, leading to the inhibition of oxidation of the copper foil surface by the alkaline solution, resulting in suppression of the overgrowth of acicular crystals of copper oxide to form a desired roughened surface having significantly fine irregularities. Specific examples of the amino functional silane coupling agent include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, and N-phenyl-3-aminopropyltrimethoxysilane, and particularly preferably is N-phenyl-3-aminopropyltrimethoxysilane. Any of them can be dissolved in an alkaline solution, are stably held in an alkaline solution, and exhibit the effect of suppressing oxidation of the copper foil surface described above. A preferred content of the amino functional silane coupling agent (for example, N-2-(aminoethyl)-3-aminopropyltrimethoxysilane) in the alkaline solution is 0.01 to 20 g/L, more preferably 0.02 to 20 g/L.

(2d) Reduction Treatment

Reduction treatment is performed on the oxidized copper foil (hereinafter referred to as oxidized copper foil) with a reduction solution. Conversion of CuO to Cu metal or $Cu_2O$ by reduction treatment can form fine irregularities of acicular crystals composed of cores consisting of Cu metal and shells consisting entirely of a mixed phase of Cu metal and $Cu_2O$ on the surface of the copper foil. This reduction treatment may be carried out by bringing the reduction solution into contact with the oxidation treated copper foil using any technique, for example, immersion of the oxidation treated copper foil in the reduction solution or showering of the reduction solution to the oxidation treated copper foil. The treatment time is preferably 2 to 60 sec, more preferably 5 to 30 sec. A preferred reduction solution is a dimethylamine borane aqueous solution, and this aqueous solution preferably contains dimethylamine borane at a content of 10 to 40 g/L. It is preferred that the dimethylamine borane aqueous solution be adjusted to pH 12 to 14 with sodium carbonate and sodium hydroxide. The temperature of the aqueous solution at this time may be room temperature although any other temperature is also available. The copper foil after the reduction treatment is preferably rinsed with water and dried. The drying temperature at this time is preferably 80 to 125° C., more preferably 110 to 120° C. The drying time may be as short as 3 to 60 sec, more preferably 5 to 30 sec.

(3) Silane Coupling Agent Treatment

Optionally, a silane coupling agent layer may be formed by applying a silane coupling agent to the copper foil, thereby improving moisture resistance, chemical resistance, and adhesion to, for example, an adhesive. The silane coupling agent can be appropriately diluted, applied and dried to form a silane coupling agent layer. The silane coupling agent layer can be formed by coating an appropriately diluted silane coupling agent and then allowing the coating to dry. Examples of the silane coupling agent include epoxy functional silane coupling agents, such as 4-glycidylbutyltrimethoxysilane and 3-glycidoxypropyltrimethoxysilane; amino-functional silane coupling agents, such as 3-aminopropyltriethoxysilane, N-2(aminoethyl)3-aminopropyltrimethoxysilane, N-3-(4-(3-amino-propoxy)butoxy)propyl-3-aminopropyltrimethoxysilane, and N-phenyl-3-aminopropyltrimethoxysilane; mercapto-functional silane coupling agents, such as 3-mercaptopropyltrimethoxysilane; olefinic functional silane coupling agents, such as vinyltrimethoxysilane and vinyl phenyl trimethoxysilane; acrylic functional silane coupling agents, such as 3-methacryloxypropyl trimethoxysilane; imidazole functional silane coupling agents, such as imidazole silane; and triazine functional silane coupling agents, such as triazine silane.

Copper Clad Laminate

The roughened copper foil of the present invention is preferably used for preparing a copper-clad laminate for printed circuit boards. That is, according to a preferred embodiment of the present invention, there is provided a copper-clad laminate comprising the roughened copper foil or a copper clad laminate prepared with the roughened copper foil. This copper-clad laminate comprises the roughened copper foil of the present invention and a resin layer provided in close contact with the roughened surface of the roughened copper foil. The roughened copper foil may be provided on one side or on both sides of the resin layer. The resin layer contains a resin, preferably an insulating resin. The resin layer is preferably a prepreg and/or a resin sheet. A prepreg is a generic term for a composite material prepared by impregnating a synthetic resin into a base material such as a synthetic resin plate, a glass plate, a glass woven fabric, a glass nonwoven fabric, and paper. Preferable examples of the insulating resin include epoxy resin, cyanate resin, bismaleimide triazine resin (BT resin), polyphenylene ether resin, and phenol resin. Examples of the insulating resin constituting the resin sheet include insulating resins such as epoxy resin, polyimide resin, and polyester resin. The resin layer may contain filler particles or others composed of various inorganic particles such as silica and alumina from the viewpoint of, for example, improving the insulating property. Although the thickness of the resin layer may have any thickness, and preferably 1 to 1000 μm, more preferably 2 to 400 μm, and still more preferably 3 to 200 μm. The resin layer may be composed of a plurality of layers. The resin layer such as the prepreg and/or the resin sheet may be provided on the roughened copper foil through a primer resin layer which is preliminarily coated on the surface of the copper foil surface.

Printed Circuit Board

The roughened copper foil of the present invention is preferably used in production of printed circuit boards. That is, according to a preferred embodiment of the present invention, there is provided a printed circuit board comprising the roughened copper foil or a printed circuit board prepared with the roughened copper foil. The printed circuit board has a layer structure including a resin layer and a copper layer laminated in this order. The resin layer is described above in connection with the copper-clad laminate. In any case, the printed circuit board may have any known layer structure. Specific examples of the printed circuit board include a single-sided or double-sided printed circuit board which is prepared by forming a circuit after bonding the roughened copper foil of the present invention to one or each surface of the prepreg into a cured laminate or a multilayer printed circuit board consisting of the printed circuit boards. Other specific examples thereof include flexible printed circuit boards, chip-on-film (COF) boards and tape-automated-bonding (TAB) tapes which includes the roughened copper foils of the present invention provided on the resin films and the circuits formed thereon. Further specific examples include a build-up circuit board formed such that the roughened copper foil is coated with the resin layer described above to form a resin-coated copper foil (RCC) which is then laminated on the printed circuit board through the resin layer which functions as an insulating adhesive layer, and subsequently a circuit is formed with the roughened copper foil as all or part of the wiring layer by a technique such as a modified semi-additive process (MSAP) or a subtractive process; another build-up circuit board in which the roughened copper foil is removed to form a circuit by a semi-additive process (SAP); and a direct build-up-on-wafer formed such that lamination of the resin-coated copper foil and circuit formation are alternately repeated on the semiconductor integrated circuit.

EXAMPLES

The present invention will be described in more detail by the following examples. In the following examples, "electrode surface" of the electrodeposited copper foil refers to the surface which has been in contact with the cathode at the time of preparation of the electrodeposited copper foil, while "deposit surface" of the electrodeposited copper foil refers to the surface on which the electrolytic copper is to be deposited, that is, the surface which has not been in contact with the cathode during the preparation of the deposited copper foil.

Example 1

The roughened copper foil of the present invention was prepared in the following manner.

(1) Preparation of Electrodeposited Copper Foil

A copper sulfate solution having a composition shown below (a copper electrolytic solution) was electrolyzed using a titanium rotating cathode having a surface roughness Ra of 0.20 μm and dimensionally stable anode (DSA) under the condition of 45° C. and a current density of 55 A/dm$^2$ into an electrodeposited copper foil having a thickness of 18 μm. The ten-point average roughness Rzjis of this electrodeposited copper foil measured by a method described later was 0.6 μm on the deposited surface side and 1.3 μm on the electrode surface side.

<Composition of Copper Sulfate Solution>
Copper content: 80 g/L
Sulfuric acid content: 260 g/L
Bis(3-sulfopropyl) disulfide content: 30 mg/L
Diallyldimethylammonium chloride polymer content: 50 mg/L
Chlorine content: 40 mg/L (2) Roughening Treatment (Oxidation-Reduction Treatment)

Two surfaces of the resulting electrodeposited copper foil was subjected to roughing treatment (oxidation-reduction treatment) in a four-step process: a first pretreatment, a second pretreatment, an oxidation treatment and a reduction treatment shown below carried out in this order.

(a) First Pretreatment

The electrodeposited copper foil prepared in Procedure (1) above was immersed in an aqueous sulfuric acid solution (sulfuric acid content: 5 mass %) at a liquid temperature of 40° C. for 1 min and then rinsed with water.

(b) Second Pretreatment

The electrodeposited copper foil after the first pretreatment was immersed in an aqueous sodium hydroxide solution (NaOH content: 50 g/L) at a liquid temperature of 40° C. for 1 min and then rinsed with water.

(c) Oxidation Treatment

The electrodeposited copper foil after the preliminary treatments was oxidation-treated. This oxidation treatment involved immersing the electrodeposited copper foil in a sodium hydroxide solution (liquid temperature: 75° C., pH: 13, chlorite content: 180 g/L, and N-phenyl-3-aminopropyltrimethoxysilane content: 15 g/L) for 2 min. Fine irregularities of acicular crystals composed of a copper complex compound mainly containing CuO were thereby formed on the two surfaces of the electrodeposited copper foil.

(d) Reduction Treatment

The electrodeposited copper foil after the oxidation treatment was reduction-treated. This reduction treatment involved immersing the electrodeposited copper foil having fine irregularities formed by the oxidation treatment in an aqueous solution (pH adjusted to 12 with sodium carbonate and sodium hydroxide and a temperature of 35° C., dimethylamine borane content: 20 g/L) for 1 min. The electrodeposited copper foil after the reduction treatment was rinsed with water and dried at 110° C. for 10 sec. Through these steps, CuO on the two sides of the electrodeposited copper foil was reduced to Cu metal or $Cu_2O$ to form the entirely roughened surface having fine irregularities composed of a copper complex compound composed of mixed phases of Cu metal and $Cu_2O$. The resulting roughened copper foil had at least one roughened surface having fine irregularities composed of acicular crystals.

(3) Analysis and Evaluation

Resulting roughened copper foil sample was analyzed and evaluated as follows.

(a) Observation of Roughened Surface (Fine Irregularities)

Figure 2:
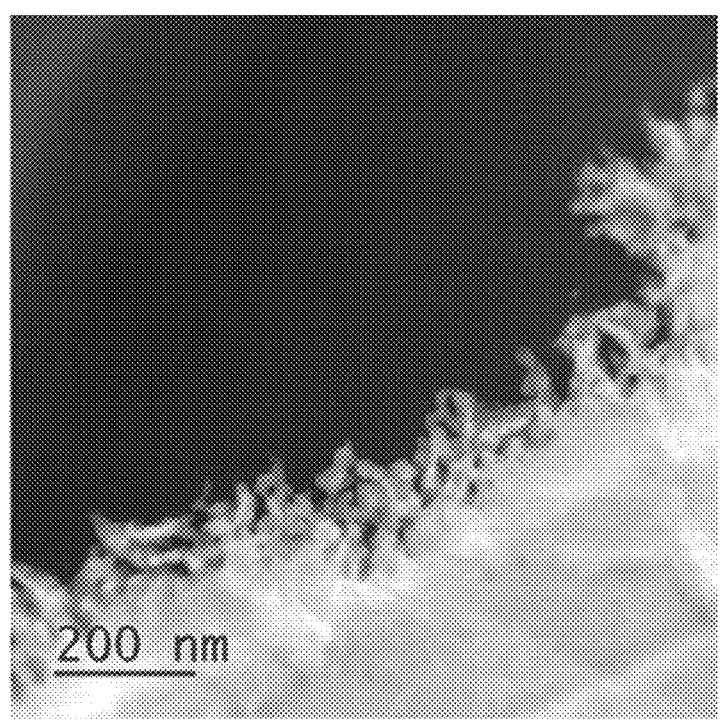
FIG. 2 is a STEM-HAADF image of a cross section of fine irregularities (in particular, acicular crystals) on the roughened surface of the roughened copper foil prepared in Example 1.
Figure 3A:
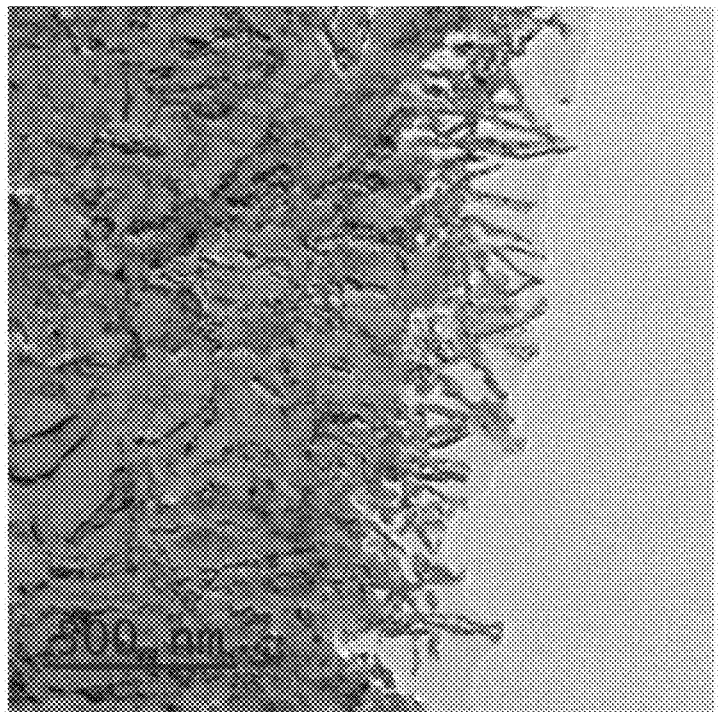
FIG. 3A is a TEM image of a cross section of fine irregularities (in particular, acicular crystals) on the roughened surface of the roughened copper foil prepared in Example 1.
Figure 3B:
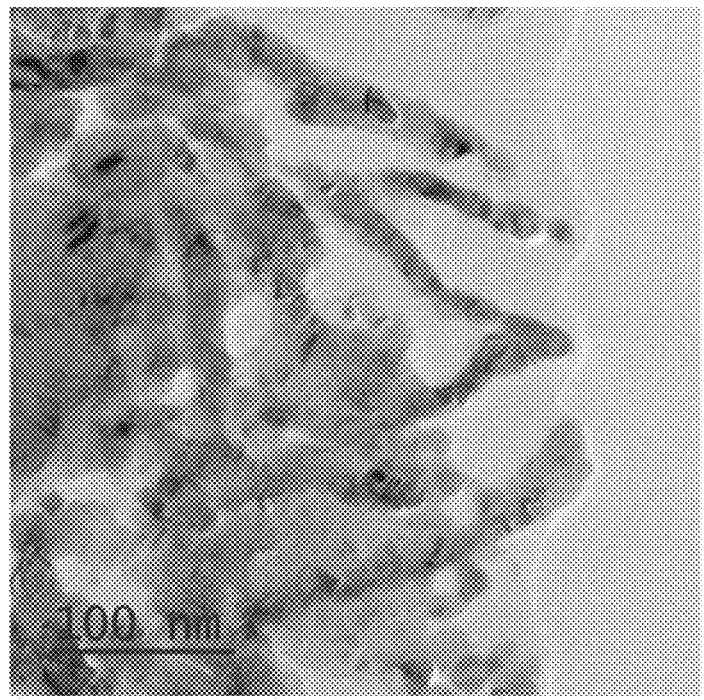
FIG. 3B is a partial enlarged image of the TEM image shown in FIG. 3.

The fine irregularities on the roughened surface (on the deposited surface side) of the roughened copper foil were observed by a cross-sectional SEM. The cross-sectional SEM image is shown in FIG. 1. FIG. 1 demonstrates that the roughened surface has fine irregularities composed of a myriad of acicular crystals. A cross section of fine irregularities (in particular acicular crystals) was also observed with a transmission electron microscope (TEM) (manufactured by JEOL Ltd., JEM-ARM 200 F) at a magnification of 200,000 times. The STEM-HAADF image is shown in FIG. 2. Furthermore, fine irregularities (in particular acicular crystals) were observed with this transmission electron microscope to take TEM images shown in FIGS. 3A and 3B. FIG. 3B is a partially magnified image of the TEM image shown in FIG. 3A. The height (the length in the direction perpendicular to the foil) of the acicular crystal was measured from the resulting STEM-HAADF image. The acicular crystal height in each sample was determined from the average value of 10 points measured within the 1 μm×1 μm region. The results are shown in Table 1.

(b) Compositional Analysis of Acicular Crystals by STEM-EELS

Compositional analysis of acicular crystals constituting fine irregularities on the surface of the roughened copper foil sample was carried out according to the following procedure.

(b-1) Pretreatment of Sample

The surface of the roughened copper foil was embedded into a curable resin, and then an ultrathin section with a target thickness of 20 nm for EELS measurement was prepared by an ultramicrotome method.

(b-2) Observation of EELS Spectrum

Figure 4:
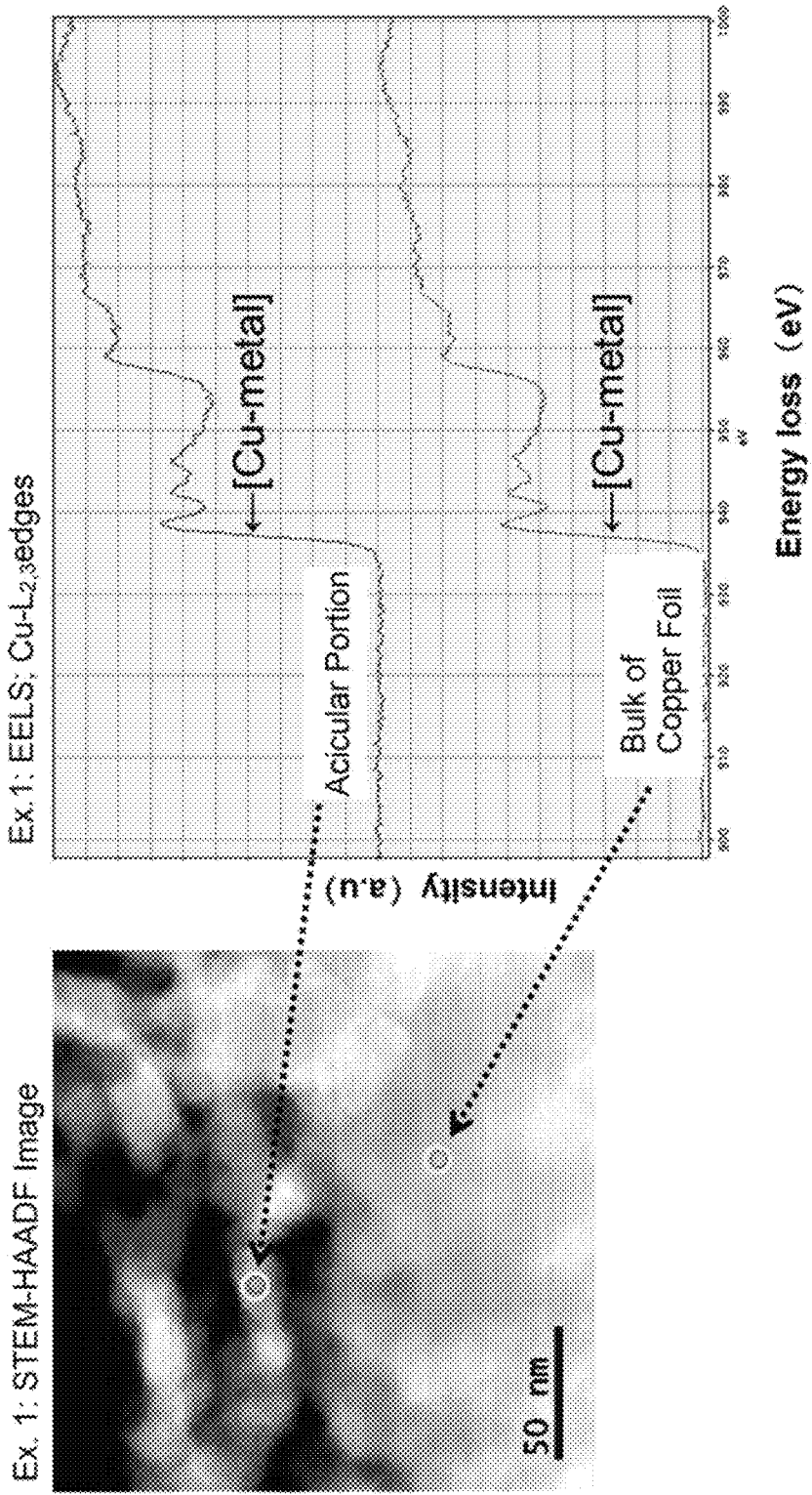
FIG. 4 is a diagram illustrating a STEM-HAADF image of acicular crystals constituting fine irregularities of the roughened copper foil prepared in Example 1, together with spectra of the EELS for $Cu-L_{2,3}$ edges observed at the respective portions of needle and the copper foil bulk, which are marked with circles in the image.
Figure 5:
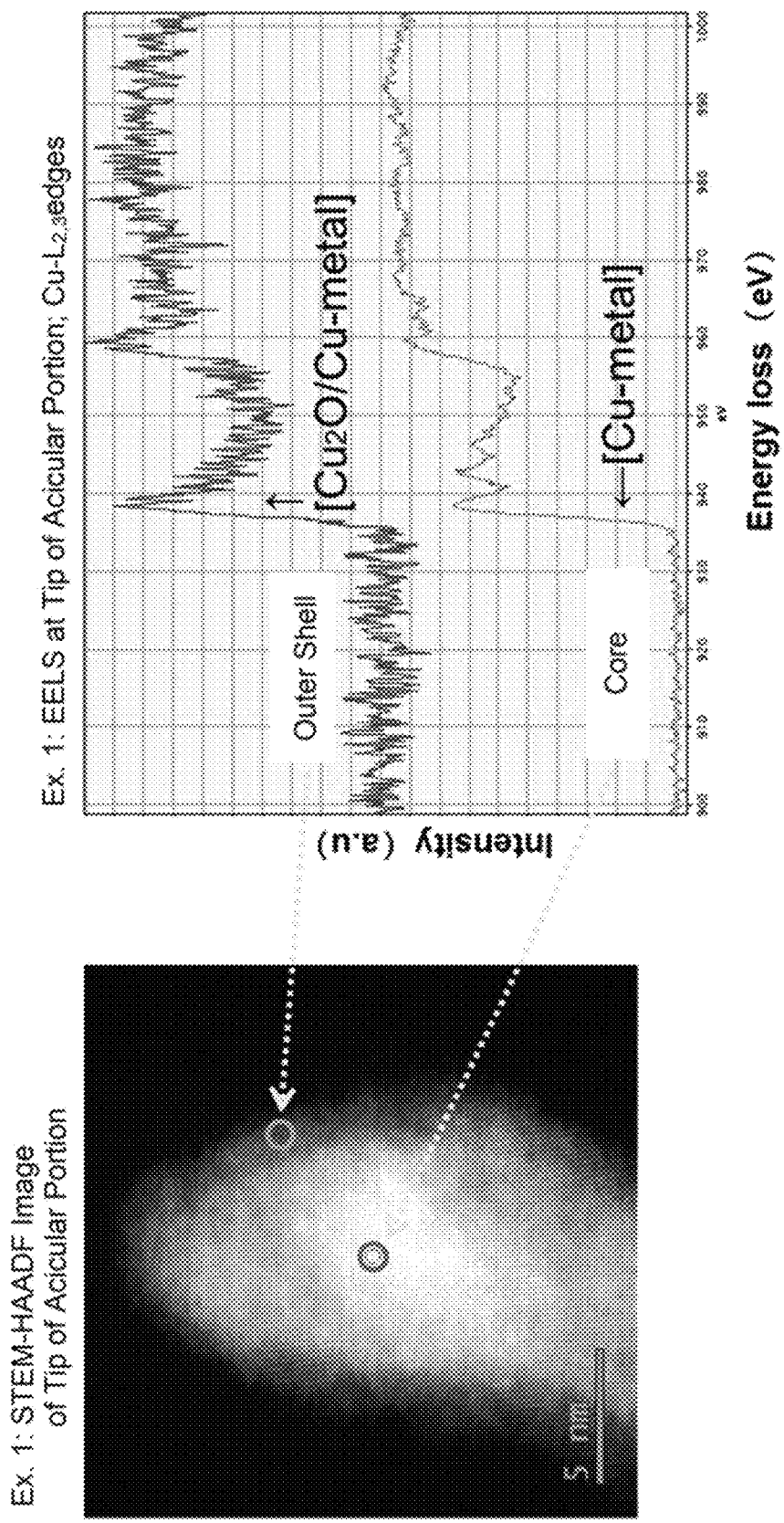
FIG. 5 is a diagram illustrating a STEM-HAADF image of the tip of the acicular crystal constituting fine irregularities of the roughened copper foil prepared in Example 1, together with spectra of the EELS for $Cu-L_{2,3}$ edges observed at the outer core and the core, which each are marked with circles in the image.

Spectra of electron energy loss spectroscopy (EELS) of the Cu-L edge were observed with a transmission electron microscope (TEM) (manufactured by JEOL Ltd., JEM-ARM 200 F). In detail, after observation with a scanning transmission electron microscope (STEM) of a high angle scattering dark field (HAADF) image (hereinafter referred to as STEM-HAADF image) of portions including acicular crystals on the roughened surface, electron energy loss spectra of the designated locations were observed. This measurement was carried out on a plurality of portions including the bulk portion (i.e., the main part of the copper foil other than the acicular crystal) of the copper foil and the interior (or core) and surface (or outer shell) of the acicular crystals in the STEM-HAADF image. The accelerating voltage was set at 200 kV, and the diameter of the electron beam spot was set at about 0.15 nm during the STEM observation. The range of energy for the observation was in the range of 900 eV to 1000 eV, which includes the Cu-L edge. FIG. 4 illustrates the STEM-HAADF image of acicular crystals in the fine irregularities of the roughened copper foil, together with spectra of the EELS for $Cu-L_{2,3}$ edges observed at the acicular portion and the bulk of the copper foil, which are marked with circles in the image. FIG. 5 illustrates a STEM-HAADF image of the tip of the acicular crystal, together with spectra of the EELS for $Cu-L_{2,3}$ edges observed at the outer shell and the core, which each are marked with circles in the image. In particular, for the surface of the acicular crystals, EELS spectra were observed for arbitrary five points.

(b-3) Analysis of EELS Spectral Data

Figure 6:
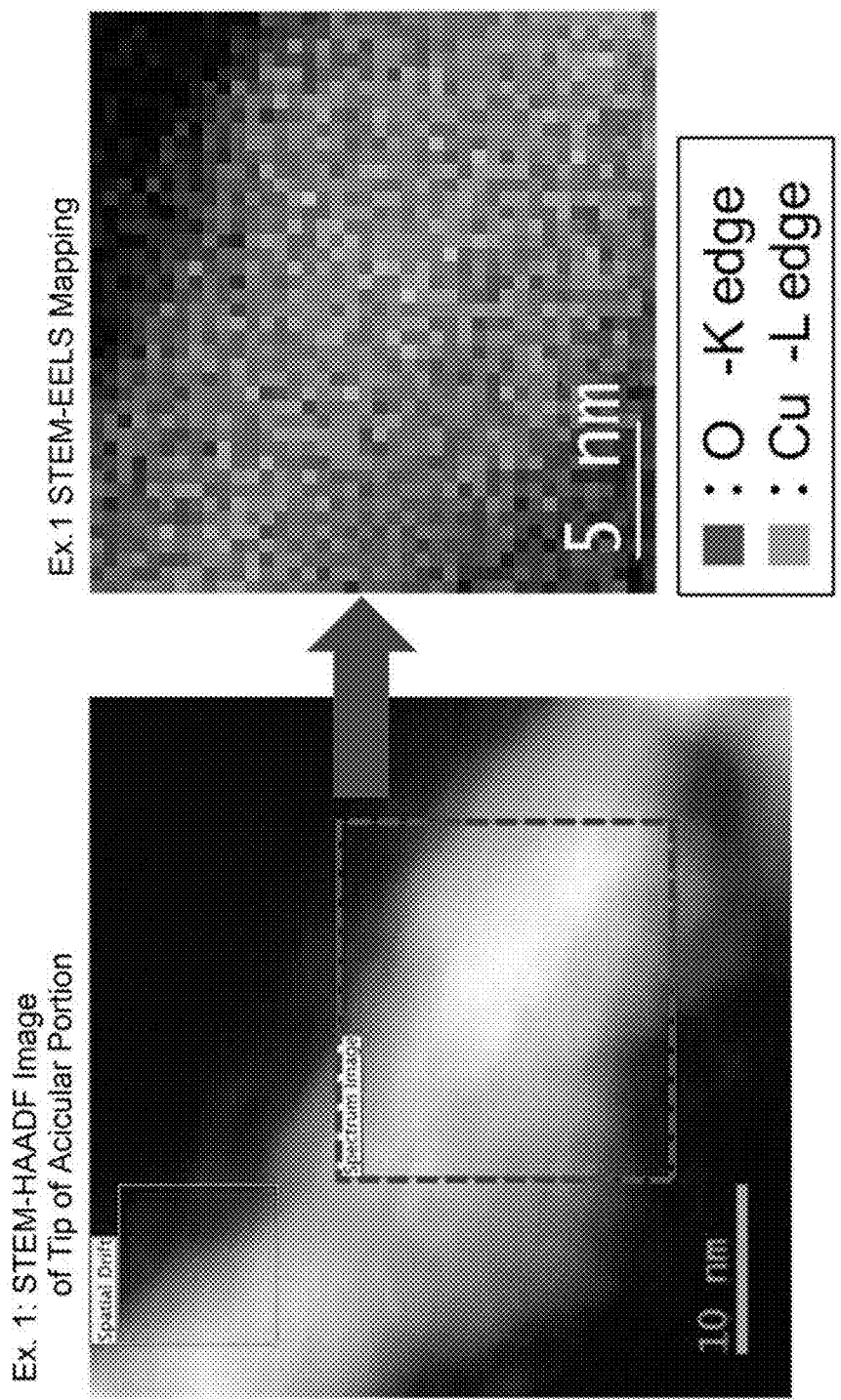
FIG. 6 is a diagram illustrating a STEM-HAADF image of the tip of the acicular crystal constituting fine irregularities of the roughened copper foil prepared in Example 1 and a STEM-EELS mapping (oxygen and copper mapping) of a region surrounded by a dotted frame.

The spectrum of the copper foil bulk portion (i.e., the main portion of the copper foil other than the acicular crystals) of the observed spectrum of the electron energy loss spectroscopy of the Cu-L edge was compared with the spectrum of the standard Cu metal sample to make correction as necessary if the energy position of the Cu-L edge is misaligned. The spectrum corrected as necessary was compared with the spectra of the electronic energy loss spectroscopy of the standard Cu-L edge of Cu metal, $Cu_2O$ and CuO characterized by the peak characteristics described later using the identification procedure to be described later in order to identify the compositions at the observed positions. For the surface of the acicular crystals, the EELS spectra were identified for the respective five measured points, and all of them were determined to be Cu metal/$Cu_2O$ mixed phases. EELS mapping of the tip portions of the acicular crystals were also performed, and it was also confirmed that oxygen existed over the entire outermost layer as shown in FIG. 6. These results concluded that the entire surface of the acicular crystals was composed of Cu metal/$Cu_2O$ mixed phases.

Identification of Cu metal, $Cu_2O$, and CuO in the analysis of EELS spectral data was carried out according to the procedure shown below. It should be noted, however, that the energy value (eV) shown below is based on the value determined by the apparatus used in the present examples, and a deviation of up to 5 eV may occur from the values disclosed in known documents. Accordingly, the term "about X eV" (X is an arbitrary value) described in the following criteria corresponds a variation in the range of X±5 eV.

<Identification of Spectrum of Cu Metal>

The spectrum attributed to Cu metal can be identified in principle by confirming items 1) to 4) below are satisfied.

1) A peak $P_{938}$ is present at about 938 eV.

2) A peak $P_{959}$ is present at about 959 eV.

3) The intensity $I_{959}$ of the peak $P_{959}$ is higher than the intensity $I_{938}$ of the peak $P_{938}$ (i.e., $I_{959}>I_{938}$).

4) Two additional peaks are present between about 940 eV and about 950 eV.

<Identification of Spectrum of $Cu_2O$>

The spectrum attributed to $Cu_2O$ can be identified in principle by confirming items 5) to 8) below are satisfied.

5) A peak $P_{936}$ is present at about 936 eV.

6) A peak $P_{957}$ is present at about 957 eV.

7) The intensity $I_{936}$ of the peak $P_{936}$ is roughly equal to the intensity $I_{957}$ of the peak $P_{957}$ (i.e., $I_{936}\approx I_{957}$).

Figure 8:
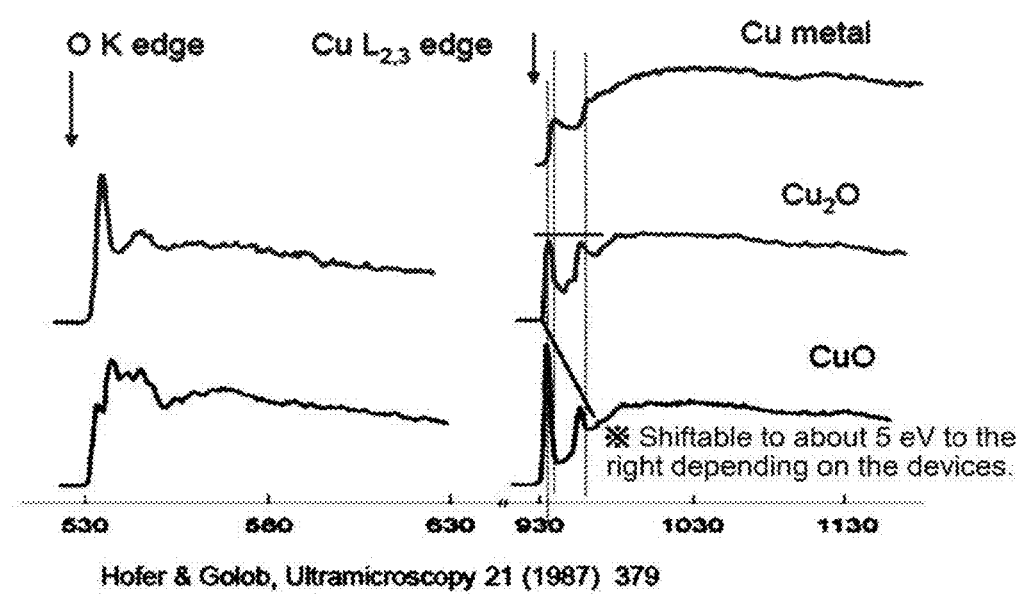
FIG. 8 is a diagram illustrating known EELS spectra of an O—K edge and $Cu-L_{2,3}$ edges of a copper oxide.

In the case of $I_{936}>I_{957}$, the spectrum is identified as that of CuO. The relationship between these two peaks can be visually understood by comparing the ratios of the intensities at the two peaks in the spectra of $Cu_2O$ and CuO derived from a known document (Hofer & Golob, Ultramicroscopy 21 (1987) 379) shown in FIG. 8 (the ratios are emphasized by the inclinations of the auxiliary lines above the two peaks in FIG. 8.).

8) Consequently, a valley is present between $P_{936}$ and $P_{957}$.

<Identification of Cu Metal/$Cu_2O$ Mixed Phase>

In the Cu metal/$Cu_2O$ mixed phase, the Cu metal spectrum and the $Cu_2O$ spectrum are overlapped into a characteristic spectrum which retains some characteristics of their own spectra to some extent, but is barely attributed to a specific phase. Specifically, the characteristic spectrum has peaks $P_{938}$ and $P_{959}$ described in item 1) and item 2), the peak intensity ratio of $I_{959}>I_{938}$ in item 3) disappears, and two peaks in the range of about 940 eV to about 950 eV in item 4) cannot be identified. The peak $P_{936}$ and the peak $P_{957}$ (described in item 5) and item 6)) are, respectively, incorporated into the peaks $P_{938}$ and $P_{959}$ (described in item 1) and item 2)), which have the energy positions close to them, to substantially disappear. Instead, unlike item 3), the intensity $I_{959}$ of the peak $P_{938}$ is roughly equal to the intensity $I_{938}$ of the peak $P_{959}$ (i.e., $I_{938}\approx I_{959}$) rather similar to item 7) above, or similar to item 3), the intensity $I_{959}$ of the peak $P_{959}$ is higher than the intensity $I_{938}$ of the peak $P_{938}$ (i.e., $I_{938}<I_{959}$). In any case, consequently, a valley is present between $P_{938}$ and $P_{959}$ according to item 8). In summary, the spectrum attributable to the Cu metal/$Cu_2O$ mixed phase can be identified in principle by confirming the items i) to iv) below are satisfied.

i) A peak $P_{938}$ is present at about 938 eV (the same as item 1)).

ii) A peak $P_{959}$ is present at about 959 eV (the same as item 2)).

iii) The intensity $I_{938}$ of the peak $P_{938}$ is roughly equal to the intensity $I_{959}$ of the peak $P_{959}$ (i.e., $I_{938}\approx I_{959}$) (similar to item 7) instead of item 3)) or higher than the intensity $I_{938}$ (i.e., $I_{938}<I_{959}$) (the same as item 3)).

iv) Consequently, a valley is present between $P_{938}$ and $P_{959}$ (similar to 8) instead of 4)).

That is, it may be said that the positions of the two peaks in the spectrum attributed to the Cu metal/$Cu_2O$ mixed phase (i.e., $P_{938}$ and $P_{959}$) coincide with the positions in the Cu metal spectrum, but the intensity ratio of the two peaks and the shape between the two peaks coincide with those of $Cu_2O$ spectrum. Accordingly, the spectrum attributed to the Cu metal/$Cu_2O$ mixed phase can be identified as follows: I) identifying the Cu metal from the position of the two peaks (i.e., $P_{938}$ and $P_{959}$); II) identifying $Cu_2O$ from the ratio of the intensities of these two peaks (i.e., $I_{938}$ and $I_{959}$) and the shape between those peaks; and III) confirming that items I) and II) are satisfied at all of the plural points (for example, five points) on the surface of the acicular crystals and/or oxygen exists throughout the outermost layer by oxygen mapping.

(c) Evaluation of Adhesion to Resin

For the roughened copper foils in various states, the normal peel strength, peel strength after moisture absorption, and peel strength after acid treatment were measured as follows for the evaluation of the adhesion to the insulating resin substrate.

(c-1) Normal Peel Strength

Two sheets of prepreg (R1551, 100 μm thick, manufactured by Panasonic Corporation) were prepared to be stacked as an insulating resin substrate. A roughened copper foil was laminated on the stacked prepregs so that the roughened surface thereof was in contact with the prepreg and was pressed using a vacuum press (pressing pressure: 2.9 MPa, temperature: 200° C., and pressing time: 90 min) to prepare a copper clad laminate. A test substrate of 0.8 mm in width having a linear circuit for measuring peel strength was then prepared on this copper clad laminate by etching. The linear circuit thus formed was peeled off from the insulating resin base material in accordance with JIS C 6481-1996, and the normal peel strength (kgf/cm) was measured. The results are shown in Table 1.

(c-2) Peel Strength after Moisture Absorption

The peel strength after moisture absorption (kgf/cm) was measured by the same procedure as that for the normal peel strength described above except that, prior to the measurement of the peel strength, the test substrate provided with the straight circuit was immersed in boiling water for 2 hrs. The results are shown in Table 1.

(c-3) Peel Strength after Acid Treatment

The peel strength (kgf/cm) after acid treatment was measured by the same procedure as that for the normal peel strength described above, except that, prior to the measurement of the peel strength, the test substrate provided with the linear circuit was immersed in 4N hydrochloric acid for 30 min. The results are shown in Table 1.

(d) Hygroscopic Heat Resistance Test

The copper clad laminate prepared from the roughened copper foil in the same manner as above was allowed to stand for 120 hrs in an environment of a humidity of 60% at a temperature of 60° C., and then the copper clad laminate was heated in a reflow furnace at a peak temperature of 270° C. for 30 sec, and this heating was repeated 10 times. After ten times of heating in a reflow furnace, presence or absence of blistering of the surface of the copper clad laminate by heating was observed. The foil with no blistering observed is determined as acceptable. The number of "acceptable" in the five tests was adopted as an index of hygroscopic heat resistance. The results are shown in Table 1.

Example 2 (Comparative)

A roughened copper foil corresponding to the roughened copper foil disclosed in Example 1 of Patent Document 1 was prepared as follows.

(1) Preparation of Electrodeposited Copper Foil

An electrodeposited copper foil was prepared as in Procedure (1) of Example 1.

(2) Roughening Treatment (Oxidation-Reduction Treatment)

Two surfaces of the resulting electrodeposited copper foil were subjected to roughing treatment (oxidation-reduction treatment) in a four-step process: a first pretreatment, a second pretreatment, an oxidation treatment and a reduction treatment shown below carried out in this order.

(a) First Pretreatment

The electrodeposited copper foil prepared in Procedure (1) above was immersed in an aqueous hydroxide solution (NaOH content: 50 g/L) at a liquid temperature of 25° C. for 5 min, and then rinsed with water.

(b) Second Pretreatment

The electrodeposited copper foil after the first pretreatment was immersed in an aqueous sulfuric acid solution (hydrogen peroxide content: 1 mass %, sulfuric acid content: 5 mass %) at a liquid temperature of 25° C. for 5 min and then rinsed with water.

(c) Oxidation Treatment

The electrodeposited copper foil after the preliminary treatment was subjected to oxidation treatment. This oxidation treatment involves immersing the electrodeposited copper foil in a sodium hydroxide solution (temperature: 70° C., pH: 12, chlorite content: 150 g/L, N-2-(aminoethyl)-3-aminopropyltrimethoxysilane content: 10 g/L) for 2 min. Fine irregularities of acicular crystals composed of a copper complex compound mainly containing CuO were thereby formed on the two surfaces of the electrodeposited copper foil.

(d) Reduction Treatment

The electrodeposited copper foil after the oxidation treatment was subjected to reduction treatment. This reduction treatment involved immersing the electrodeposited copper foil having fine irregularities formed by the oxidation treatment in an aqueous solution (dimethylamine borane content: 20 g/L, pH adjusted to 12 with sodium carbonate and sodium hydroxide and a temperature of 35° C.) for 1 min. The electrodeposited copper foil after the reduction treatment was rinsed with water and dried at 130° C. for 20 sec. The resulting roughened copper foil had roughened surfaces with fine irregularities of acicular crystals on two sides.

(3) Analysis and Evaluation

Figure 7:
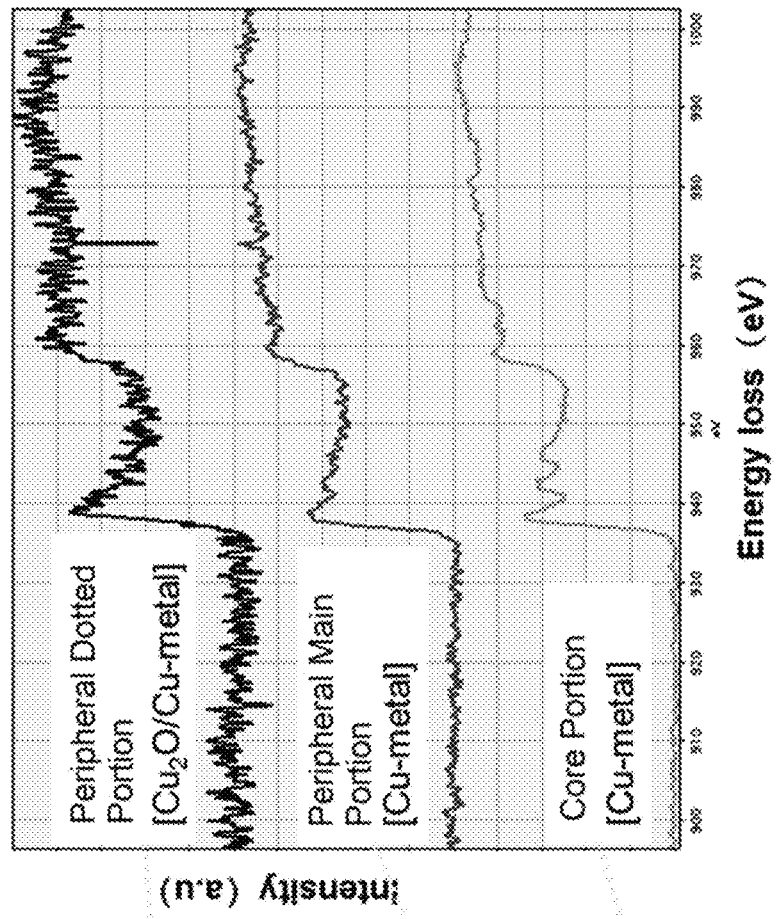
FIG. 7 is a diagram illustrating a STEM-HAADF image of the tips of the acicular crystals constituting fine irregularities of the roughened copper foil prepared in Example 2, together with spectra of the EELS for $Cu-L_{2,3}$ edges observed at the peripheral dotted portion, the peripheral main portion, and the core portion, which each are marked with circles in the image.
Figure 7:
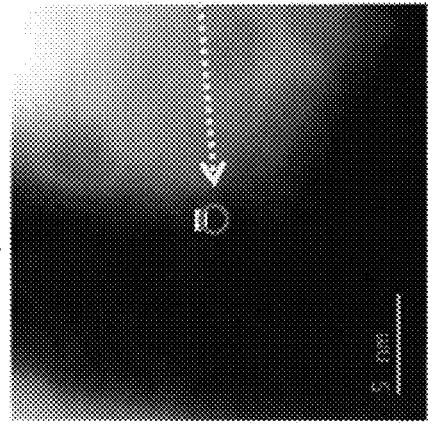

Resulting roughened copper foil sample was analyzed and evaluated as in Example 1. The results are shown in Table 1. FIG. 7 illustrates a STEM-HAADF image of the tips of the acicular crystals constituting fine irregularities of the roughened copper foil prepared in the Example 2, together with spectra of the EELS for Cu-$L_{2,3}$ edges observed at the peripheral dotted portion, the peripheral main portion, and the core portion, which each are marked with circles in the image. As shown in FIG. 7, the outer core of the acicular crystals is composed of Cu metal, but the mixed phases of the Cu metal/$Cu_2O$ are localized on the surface of the acicular crystals.

Example 3 (Comparative)

A roughened copper foil corresponding to the roughened copper foil disclosed in the comparative example of Patent Document 1 was prepared as follows.

(1) Preparation of Electrodeposited Copper Foil

An electrodeposited copper foil was prepared as in Procedure (1) of Example 1.

(2) Roughening Treatment (Oxidation-Reduction Treatment)

Two surfaces of the resulting electrodeposited copper foil were subjected to roughening treatment (oxidation-reduction treatment) in a four-step process: a first pretreatment, a second pretreatment, an oxidation treatment and a reduction treatment shown below carried out in this order.

(a) First Pretreatment

The electrodeposited copper foil prepared in Procedure (1) above was immersed in an aqueous sodium hydroxide solution (NaOH content: 50 g/L) at a liquid temperature of 25° C. for 5 min and then rinsed with water.

(b) Second Pretreatment

The electrodeposited copper foil after the first pretreatment was immersed in an aqueous sulfuric acid solution (hydrogen peroxide content: 1 mass % and sulfuric acid content: 5 mass %) at a liquid temperature of 25° C. for 5 min and then rinsed with water.

(c) Oxidation Treatment

The electrodeposited copper foil after the preliminary treatment was oxidation-treated. This oxidation treatment involved immersing the above electrodeposited copper foil in an aqueous solution ("PRO BOND 80A OXIDE SOLUTION" content of 10 vol % and "PRO BOND 80B OXIDE SOLUTION" content of 20 vol %, which are oxidation treatment liquids manufactured by Rohm and Haas Electronic Materials Co., Ltd.) at a liquid temperature of 85° C. for 5 min. Fine irregularities of acicular crystals composed of a copper complex compound mainly containing CuO were thereby formed on the two surfaces of the electrodeposited copper foil.

(d) Reduction Treatment

The electrodeposited copper foil after the oxidation treatment was reduction-treated. This reduction treatment involved immersing the above electrodeposited copper foil subjected to oxidation treatment in an aqueous solution ("CIRCUPOSIT PB OXIDE CONVERTER 60C" content of 6.7 vol % and "CUPOSIT Z" content of 1.5 vol %, which are reducing treatment liquids manufactured by Rohm and Haas Electronic Materials Co., Ltd.) at a liquid temperature of 35° C. for 5 min. The electrodeposited copper foil after the reduction treatment was rinsed with water and dried at 130° C. for 20 sec. The resulting roughened copper foil had roughened surfaces with fine irregularities of acicular crystals on two sides.

(3) Analysis and Evaluation

Resulting roughened copper foil sample was analyzed and evaluated as in Example 1.

The results are shown in Table 1.

TABLE 1

| | Roughened surface (fine irregularities) | | | | Adhesion to resin | | | Hygroscopic |
|---|---|---|---|---|---|---|---|---|
| | Shape of crystal constituting fine irregularities | Composition of core of acicular crystal | Composition of surface of acicular crystal | Acicular crystal height (nm) | Normal peel strength (kgf/cm) | Peel strength after moisture absorption (kgf/cm) | Peel strength after acid treatment (kgf/cm) | heat resistance Acceptance rate from five tests (times/5) |
| Ex. 1 | Acicular crystal | Cu metal | Mixed phase of Cu metal/$Cu_2O$ over the entire surface (Thickness of mixed phase: 10 nm or less) | 150 | 0.7 | 0.7 | 0.7 | 5/5 |

TABLE 1-continued

|  | Roughened surface (fine irregularities) | | | | Adhesion to resin | | | Hygroscopic |
| --- | --- | --- | --- | --- | --- | --- | --- | --- |
|  | Shape of crystal constituting fine irregularities | Composition of core of acicular crystal | Composition of surface of acicular crystal | Acicular crystal height (nm) | Normal peel strength (kgf/cm) | Peel strength after moisture absorption (kgf/cm) | Peel strength after acid treatment (kgf/cm) | heat resistance Acceptance rate from five tests (times/5) |
| Ex 2* | Acicular crystal | Cu metal | Main portion of surface: Cu metal (where mixed phase of the Cu metal/$Cu_2O$ are localized) | 150 | 0.6 | 0.4 | 0.5 | 3/5 |
| Ex 3* | Acicular crystal | Cu metal | Main portion of surface: Cu metal (where mixed phase of the Cu metal/$Cu_2O$ are localized) | 500 | 0.5 | 0.3 | 0.3 | 0/5 |

*indicates a comparative example.

The invention claimed is:

1. A roughened copper foil having at least one roughened surface having fine irregularities consisting of acicular crystals, wherein an entire surface of the acicular crystals consists of a mixed phase of Cu metal and $Cu_2O$ having a thickness of 10 nm or less, and the interior of the acicular crystals consists of a single phase of Cu metal.

2. The roughened copper foil according to claim 1, wherein a height of the acicular crystal is in a range of 50 to 400 nm.

3. The roughened copper foil according to claim 1, wherein the fine irregularities are formed through oxidation-reduction treatment.

4. A copper clad laminate comprising the roughened copper foil according to claim 1.

5. A printed circuit board comprising the roughened copper foil according to claim 1.

* * * * *